United States Patent [19]

Lin et al.

[11] Patent Number: 5,019,483

[45] Date of Patent: May 28, 1991

[54] AQUEOUS DEVELOPABLE PHOTORESIST CONTAINING WEAK ALKALI SOLUBLE OR DISPERSIBLE THIOL COMPOUNDS

[75] Inventors: Dhei-Jhai Lin, Taoyuan; Jim-Chyuan Shieh, Miaoli Hsien; Hsien-Kuang Lin, Taipei, all of Taiwan

[73] Assignee: 501 Industrial Technology Research Institute, Hsinchu, Taiwan

[21] Appl. No.: 406,461

[22] Filed: Sep. 13, 1989

[51] Int. Cl.$^5$ .................. G03C 1/725; G03C 1/73
[52] U.S. Cl. ............................ 430/288; 430/281; 430/285; 430/286
[58] Field of Search ............... 430/281, 288, 286, 277; 522/16, 14, 39; 526/214, 222, 224

[56] References Cited

U.S. PATENT DOCUMENTS

| | | | |
|---|---|---|---|
| 3,364,182 | 1/1968 | Griffith et al. | 526/214 |
| 3,660,088 | 5/1972 | Lundsager | 430/273 |
| 3,767,398 | 10/1973 | Morgan | 430/287 |
| 3,883,352 | 5/1975 | Kloczewski et al. | 430/286 |
| 4,179,531 | 12/1979 | Hein et al. | 430/300 |
| 4,234,676 | 11/1980 | Hein et al. | 430/300 |
| 4,361,640 | 11/1982 | Pine | 430/281 |
| 4,413,108 | 11/1983 | Janssen | 526/214 |
| 4,415,651 | 11/1983 | Proskow | 430/287 |
| 4,629,680 | 12/1986 | Iwasaki et al. | 430/281 |
| 4,942,109 | 7/1990 | Koizumi et al. | 430/285 |

*Primary Examiner*—Charles L. Bowers, Jr.
*Assistant Examiner*—John S. Y. Chu
*Attorney, Agent, or Firm*—Ladas & Parry

[57] ABSTRACT

An aqueous alkali developable photoresist composition consists of (a) a carboxyl group-containing polymeric binder, (b) 1–15% by weight of a photoinitiator based on the binder, (c) 20–100% by weight based on the binder, of a photo reactive monomer or oligomer containing at least two ethylenically unsaturated double bonds, and (d) 0.05–5% by weight based on the binder of a weak alkali soluble or dispersible thiol compound represented by

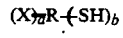

$$(X)_a R \text{-}(SH)_b$$

where a, b are integers equal to or greater than 1, R is an organic moiety of molecular weight less than 500, and X is a carboxyl group-containing moiety or hydrophilic organic polymeric segment with less than 100 repeating unit.

15 Claims, No Drawings

AQUEOUS DEVELOPABLE PHOTORESIST CONTAINING WEAK ALKALI SOLUBLE OR DISPERSIBLE THIOL COMPOUNDS

BACKGROUND OF THE INVENTION

This invention relates to a dry film photoresist composition used in the fabrication of a printed circuit board, and particularly to a composition for forming a photoresist film which is developable in an aqueous solution of alkali.

Aqueous alkali developable dry film photoresist have become widely accepted in the fabrication of printed circuit boards due to its lower environmental contamination in comparison with the organic solvent developing counterpart. A typical process using a negative working aqueous alkali developable photoresist in the manufacture of a printed circuit board includes laminating a photoresist film onto a copper-clad substrate, exposing the photoresist film to ultraviolet light through an artwork or a layer formed of an image-bearing transparency, removing the unexposed part of the photoresist layer by means of a weak aqueous alkali solution, leaving the exposed part of the layer or a photoresist image on the copper clad substrate, etching the exposed part of the copper, thus leaving the part of the copper which is covered by the photoresist image, and removing the photoresist image from the substrate by a relatively stronger aqueous alkali solution.

A dry film photoresist generally consists of three layers. The first layer is a transparent polyester protective layer having a thickness of about 25 $\mu$m, the second layer is a light-sensitive layer having a thickness of about 25–75 $\mu$m, and the third layer is usually a polyethylene film with a thickness of about 25 $\mu$m. It is known that a negative working aqueous akali developable dry film photoresist consists primarily of a carboxyl-containing polymeric binder, a monomer or an oligomer having ethylenically unsaturated functional groups, an initiator which produces free radicals upon exposure to actinic radiation, and additives such as dyes, plasticizers, and adhesion promoter etc.

Carboxyl group-containing binders are usually composed of acrylic polymers such as copolymers of methacrylic acid or acrylic acid. Examples of these polymers are disclosed in U.S. Pat. Nos. 4,535,052, and 4,234,675. Basically, a binder should be soluble in an aqueous alkali solution, and be able to provide the photoresist composition with fast dissolution properties in the developing stage.

It is generally agreed that adhesion of the photoresist pattern to the copper surface is important, particularly when fine line patterning is involved. A small amount of adhesion promoting agent was therefore incorporated in the photoresist composition. Typical examples are silane compounds, as disclosed in U.S. Pat. No. 3,758,306, and 2-mercaptobenzothiazole as disclosed in U.S. Pat. Nos. 3,758,306, 4,339,527 and 4,230,790.

However, due to the strong coupling reaction between the silane compound and the copper surface, difficulties in complete wash off of the unexposed photoresist result, leaving photoresist residue or scum on the copper surface and causing problems in etching and plating.

The 2-mercaptobenzothiazole, which is a thiol containing compound, also has a moderate reactivity with the metal copper surface, and often leaves a thin film of residual materials on the copper surface in the non-exposed area after pattern developing. Therefore, a problem similar to that of the silane compound is encountered. Furthermore, 2-mercaptobenzothiazole react with copper to produce a complex compound, as evidenced by the reddish color on the copper substrate, might cause contamination of the etching and plating solution.

As a matter of fact, the inclusion of a small amount of a thiol containing compound is known to accelerate photo-initiated free radical propagation through chain transfer reactions, and hence, is useful in photosensitive composition. There are many thiol compounds containing photosensitive compositions as taught in many literatures and patents. These compositions are exposed to ultra violet light, sometimes in conjunction with thermal energy, would induce an addition reaction between the thiol groups and ethylenically unsaturated double bonds. Generally, a polythiol and a polyene which undergo the addition reaction have substantially equivalent molar functionalities and can be cured with or without photoinitiators. Typical examples can be found in U.S. Pat. Nos. 3,976,553, 3,966,794, 3,908,039, 4,008,341, 4,230,740, 3,843,572, 3,904,499, 3,936,530 and 3,660,088. These photo curable compositions are mainly useful for molding articles, coatings, adhesives and sealants, and only a few of them are used as orgainic solvent developable photoresists. The polythiol employed predominantly are the commercially available pentaerythritol tetra(mercaptoacetate), pentaerythritol tetrakis($\beta$-mercaptopropionate) or trimethylolpropane tris (3-mercaptopropionate).

The above described polyfunctional thiol compounds have relatively high molecular weights such that the level of the typical mercaptan odor can be kept in the acceptable range as large amount is used in this kind of compositions. These polythiols are different from the thiol compounds disclosed in this instant invention, and neither of them are suitable for use in this instant invention.

Generally, polythiols contained in known photoresist films are not soluble in a weak alkaline aqueous solution. It is found that, when these insoluble polythiols are used in an aqueous developable photoresist composition, they produce scum on the area of the copper image. The scum left on the copper surface and the etching solution during the etching process, adversely affects the quality of the wiring of the circuit printed on the substrate.

The polyenes employed in the above mentioned patents predominantly carry allyl and vinyl functionalities. The polyenes with acrylic functionalities are not suitable for the compositions mentioned in the above patents due to their relatively high reactivity towards polythiol, which cause the problem in stability, particularly for the liquid composition with high content of polythiol as in most of the compositions disclosed in the above mentioned patents.

SUMMARY OF THE INVENTION

The objective of the invention is to provide an aqueous alkali-developable photoresist composition which enhances adhesion between the composition and the surface of a copper clad substrate, and advantageously leave no residue or scum from the composition on the copper surface after development in weak alkali solution. Moreover, the exposed photoresist film can be removed easily from the copper surface and dissociated into small fragments in the alkaline stripping solution, thereby minimizing the risk of blocking the spray nozzles of strippers commonly used in the printed circuit board industry.

The instant invention provides an aqueous alkali developable photoresist composition which consists of a) a carboxyl group-containing polymeric binder, b) 1-15% by weight of a photoinitiator based on the binder, c) 30-100 % by weight based on the binder, of photoreactive monomer or oligomer having at least two ethylenically unsaturated double bonds per molecule, and d) 0.05-5% by weight, based on the binder, of a thiol compound represented by $(X)_a R—(SH)_b$, where a, b are integers equal to or greater than 1, R is an organic moiety of molecular weight less than 500, and X is a carboxyl group-containing moiety or a hydrophilic organic polymeric segment with less than 100 repeating unit. The thiol compound used in the present invention is different from those described in the abovementioned patents and will be described hereinbelow.

The polymeric binder used in the present invention is a film-forming thermoplastic polymer or mixture of thermoplastic polymers which is soluble in an aqueous solution of alkali. The preferable weight average molecular weight of the binder ranges from 10,000-1,000,000, and the acid number of the binder is more than 70. Suitable polymers for the binder are copolymers obtained by copolymerization of monomers consisting at least of an acrylic acid or a methacrylic acid and other copolymerizable monomers such as alkyl acrylates or alkyl methacrylates. Suitable alkyl acrylates are hexyl acrylate, butyl acrylate, ethyl acrylate and methyl acrylate. Suitable alkyl methacrylates are hexyl methacrylate, butyl methacrylate, ethyl methacrylate and methyl methacrylate. Another suitable copolymerizable monomers used for forming the binder are benzyl acrylate, benzyl methacrylate, phenoxy ethyl acrylate, phenoxy ethyl methacrylate, hydroxy ethyl acrylate, hydroxy ethyl methacrylate, butoxy ethyl acrylate, butoxy ethyl methacrylate, 2-hydroxy propyl acrylate and 2-hydroxy propyl methacrylate. Still another suitable copolymerizable monomers are β-carboxy ethyl acrylate, phthalic acid acrylate, and phthalic acid methacrylate. Optionally, any one of the last three monomers can replace the role of acrylic acid or methacrylic acid in the said constituent of the binder polymer as they similarly contain a carboxylic acid group.

Preferably, the binder is formed by the copolymerization of a composition containing: (a) 15-45 mole %, based on total moles of the composition, of a monomer or a mixture of monomers selected from acrylic acid, methacrylic acid, β-carboxy ethyl acrylate, phthalic acid acrylate and phthalic acid methacrylate; (b) 55-85 mole % based on total moles of the composition, of a monomer or a mixture of monomers selected from methyl methacrylate, hydroxy ethyl methacrylate, ethyl acrylate, ethyl methacrylate, butyl acrylate, and butyl methacrylate, and (C) 0-10 mole % based on total moles of the composition, of a monomer or a mixture of monomer selected from benzyl acrylate, benzyl methacrylate, phenoxy ethyl acrylate and phenoxy ethyl methacrylate.

Another preferable binder may be a copolymer of esterified styrene-maleic acid anhydride. Still another preferable binder may be a mixture of the above-mentioned two preferable binder.

Suitable photoreactive monomers or oligomers for the present invention are commercially available photosensitive monomers or oligomers containing at least two reactive unsaturated functional groups such as acrylates or methacrylates, for example, butanediol diacrylate, hexanediol diacrylate, ethylene glycol diacrylate, polyethylene glycol diacrylate, propylene glycol diacrylate, polypropylene glycol diacrylate, polybutanediol diacrylate, alkoxylated aliphatic diacrylate and polyethoxylated bisphenol A diacrylate, aliphatic and aromatic urethane diacrylate, and epoxy diacrylates of various molecular weights, trimethylolpropane triacrylate and its ethoxylated derivatives, pentaerythritol triacrylate, alkoxylated aliphatic tri- or tetra-acrylates, dipentaerythritol polyacrylates. Also suitable components are the methacrylic counterparts of the above listed polyacrylates. The amount of the photo reactive monomers or oligomers used is 20-100 % by weight based on the binder.

Suitable photoinitiators for use in the present invention are: ketones such as benzophenone, aceto phenone, benzyl, benzocyclobutanone, etc.; derivatives of acryloin such as benzoin methylether, benzoin ethyl ether, etc.; substituted benzophenones such as Michler's ketone, dimethoxy acetophenone, diethoxy acetophenone, halogenated benzophenone, etc.; quinones such as benzoquinone, anthraquinone, phenanthraquinone, etc.; substituted multinuclear quinones such as chloro anthraquinone, methylanthraquinone, octa-methyl anthraquinone, naphthoquinone, dichloro-naphthoquinone, etc. One or a mixture of the above-mentioned photoinitiators can be used in the present invention. The suitable amount of the photoinitiator used may be 0.1-15 % by weight based on the binder.

Suitable thiol compounds for the invention are those possessing hydrophilic nature and represented by the formula

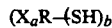

where a, b are integers of no less than one, X is either a carboxyl group-containing moiety or a low molecular weight hydrophilic polymeric segment, and R is an organic moiety preferably of aliphatic segment with a molecular weight of less than 500. Therefore, suitable thiol compounds for this invention are carboxyl group-containing thiol compounds and hydrophilic polymeric segments containing thiol compounds.

The carboxyl group-containing thiol compounds readily available commercially are, for examples, mercaptoacetic acid, α-mercaptopropionic acid, β-mercaptopropionic acid, 4-mercaptobutyric acid, mercaptoundecyclic acid, o-mercaptobenzoic acid and p-mercaptobenzoic acid. However, due to the high volatility, the first 3 thiol compounds listed above has limited use in this invention.

Other suitable carboxylic group-containing thiol compounds are those obtained through the addition reaction of hydrogen sulfide or a polythiol compound having at least two reactive thiol groups with carboxyl group-containing alkene. The alkene may contain one or two ethylenically unsaturated double bond. However, alkenes containing single ethylenically unsaturated double bond are preferred because they avoid gellation during the addition reaction. The number of the ethylenically unsaturated duble bond per polythiol compound should preferably be at least one unit less than the thiol functionality on the polythiol molecule in the reaction mixture.

Suitable polythiol compounds for the abovedescribed addition reaction are ethane dithiol, hexamethylene dithiol, decamethylene dithiol, toluene-2,4-dithiol, ethylene glycol bis(thioglycolate), ethylene glycol bis($\beta$-mercaptopropionate), trimethylo propane tris(thioglycolate), trimethylo propane tris($\beta$-mercaptopropionate), pentaerythritol tetrakis(thioglycolate) and polypropylene ether glycol bis ($\beta$-mercapto-propionate). Suitable alkenes for the above addition reaction are those having single or more carboxyl group, such as acrylic acid, propionic acid, crotonic acid, 3-butenoic acid, methacrylic acid, 2-pentenoic acid, 3-methyl crotonic acid, 4-pentenoic acid, tiglic acid, 4-methyl-2-pentenoic acid, 2-hexenoic acid, 3-hexenoic acid, 2-heptenoic acid, 3-heptenoic acid, 2-octenoic acid, 3-octenoic acid, 2-nonenoic acid, 3-nonenoic acid, 2-decenoic acid, 2-undecenoic acid, 10-undecenoic acid, trans-2-dodecenoic acid, 2-tridecenoic acid, and 2-hexadecenoic acid. Another suitable alkenes are fumaric acid, maleic acid, citraconic acid, itaconic acid, mesaconic acid, trans-2-butene-1,4-dicarboxylic acid, traumatic acid, etc.

Still another suitable carboxyl group-containing thiol compounds are those obtained by the esterification reaction of a polythiol and a cyclic acid anhydride. Suitable cyclic acid anhydride are succinic anyhydride, phthalic anhydride, etc. The number of thiol functionality of the polythiol should be, at least, one unit greater than the number of anhydride per polythiol molecule in the reaction mixture.

The said hydrophilic polymeric segment containing thiol compound includes at least one thiol group as well as a polymeric segment of hydrophilic nature selected from polyvinyl alcohol, polyethylene glycol, and polyvinyl methyl ether. The hydrophilic polymeric segment containing thiol compounds may be those obtained through the addition reaction of hydrogen sulfide or a polythiol compound having at least two thiol groups with hydrophilic polymeric segment containing alkenes having at least one ethylenically unsaturated double bond. The alkenes preferably contain one ethylenically unsaturated double bond which avoids gellation during the reaction. The number of thiol functionality in the polythiol compound should be at least one unit greater than the number of ethylenically unsaturated double bond per polythiol molecule in the addition reaction mixture.

Suitable hydrophilic polymeric segment containing alkenes are alkenes having a segment of polyethylene glycol or polyvinyl methyl ether or polyvinyl alcohol, in which the number of the repeating units is less than 100, for example, polyethylene glycol acrylate or polyethylene glycol methacrylate.

Another suitable hydrophilic group-containing thiol compounds are those obtained through the addition reaction of hydrogen sulfide or a polythiol with a water soluable or dispersible aliphatic monoepoxide.

The appropriate reaction conditions for the above described addition or condensation reactions involving polythiol compounds can be found in many literatures, for example, "The Chemistry of the Thiol Group" edited by Saul Patai, John Wiley & Sons, 1974, or "Organic Reactions" Vol. 13 by F. W. Stacey and J. F. Harris, Chapter IV, Wiley, London 1963. There are many other synthesis routes to achieve the desired thiol structure for this invention. Therefore the embodiment of the invention is not limited to the synthesis methods described.

The present invention will be described in more details with the following non-limiting examples.

EXAMPLE 1

Thiol compound A was prepared from the following compounds:

| Components | Amount |
| --- | --- |
| Itaconic acid | 7.8 g |
| Pentaerythritol tetra (mercapto-acetate) | 18 g |
| 2,2'-Azobisisobutyronitrile | 0.0656 g |
| hydroquinone | 0.0088 g |
| methyl ethyl ketone | 16 g |
| Isopropanol | 2 g |

The above-described compounds were placed in a closed glass container and heated to 60 degree C. The reaction was stopped when the reaction mixture achieved a substantially constant viscosity. The time of the reaction was about 4 hours. Low molecular weight volatile substances were removed from the product by a room temperature vacuum operation. The obtained product was soluble in a 1% sodium carbonate aqueous solution.

EXAMPLE 2

Thiol compound B was prepared from the following compounds:

| Components | Amount |
| --- | --- |
| Pentaerythritol tetra (mercapto-acetate) | 4.32 g |
| polyethylene glycol methacrylate (manufactured by Interez Company) | 10.52 g |
| 2,2' azobisisobutyronitrile | 0.0033 g |
| hydroquinone | 0.00022 g |
| methyl ethyl ketone | 0.69 g |

The above-described components were placed in a closed glass container and heated to 60 degree C. The reaction was stopped after 2.5 hours. Then, low molecular weight volatile substances were removed from the product by vacuum. The obtained product was soluble in a 1% aqueous sodium carbonate solution. The polyethylene glycol methacrylate used therein had a weight (number) average molecular weight of 526.

EXAMPLE 3

Thiol compound C was prepared from the following compounds:

| Compounds | Amount |
| --- | --- |
| Pentaerythritol tetra (mercapto-acetate) | 8.64 g |
| Photomer 6173 (carboxyl-containing polymer manufactured by Henkel Company) | 7.44 g |
| 2,2' Azobisisobutyronitrile | 0.00164 g |
| Hydroquinone | 0.00012 g |
| Methyl ethyl ketone | 0.35 g |

The above-described components were put in a closed glass container and heated to 60 degree C. The time of the reaction was more than 2.5 hours until the viscosity did not increase further. Volatile substances were removed from the product under vacuum. The product obtained was soluable in a 1% sodium carbonate aqueous solution.

EXAMPLE 4

Thiol compound D was prepared from the following compounds:

| Compounds | Amount |
|---|---|
| Pentaerythritol tetra (mercapto-acetate) | 4.32 g |
| Polyethylene glycol methacrylate | 5.26 g |
| Photomer 6173 | 2.48 g |
| 2,2' Azobisisobutyronitrile | 0.00328 g |
| Hydroquinone | 0.00022 g |
| Methyl ethyl ketone | 0.69 g |

The procedure of the experiment of this example was similar to that of Example 2.

EXAMPLE 5

| Components | Amount |
|---|---|
| XL-27 (Polyacrylic acid polymer manufactured by B. F. Goodrich Company) | 4 g |
| SMA-540 (esterified styrene-maleic anhydride copolymer of Monsanto Company) | 1 g |
| Benzil dimethyl ketal | 0.5 g |
| Micheler's Ketone | 0.001 g |
| Trimethylolpropane triacrylate | 1.75 g |
| Tetra ethoxylated bisphenol A diacrylate | 1 g |
| Urethane acrylate | 0.5 g |
| Blue 603 (dye manufactured by Orient Co.) | 0.0075 g |
| Methoxy hydroquinone ether | 0.02 g |

The above-described composition and 0.03 g of thiol compound A were dissolved in suitable solvents and blended thoroughly. The blended photosensitive composition was applied to a 20×25 sq.cm polyethylene terephthalate film by means of doctor blade. The thickness of the applied film after being dried was about 30 micron. The photosensitive film was heated to 103 degree C. and then adhered by means of a roller laminator to the surface of a copper substrate which was precleaned to be free of oil and dirt in a cleaning solution. An ultra violet light printer with a 3 KW lamp (Model ORC HMW 532) was used for the exposure of the sample at an exposure energy of 70 mJ/sq.cm. The art work used during the exposure had line and space patterns of different widths. The photoresist film was developed in 1% sodium carbonate aqueous solution by a nozzle spray developer manufactured by Circuitape for about 140 seconds

EXAMPLE 6

(comparative example)

The experiment was carried out in the same manner described in Example 5 except that thiol compound A was excluded from the composition of Example 5.

EXAMPLE 7 (comparative example)

The experiment was carried out in the same manner described in Example 5 except that thiol compound A was replaced by 0.02 g of pentaerythritol tetra (mercaptoacetate) which is not soluble in an aqueous alkali solution.

EXAMPLE 8 (comparative example)

The experiment was carried out in the same manner as described in Example 5 except that thiol compound A was replaced by 0.015 g of mercaptobenzothiazole which is not soluble in an aqueous alkali solution.

Tests were made to investigate the properties of the samples obtained from the experiments of Examples 5, 6, 7 and 8. A scum test commonly empolyed by printed circuit fabricators were used. In the scum test, the copper surface which is not covered by the developed photoresist pattern is flash-etched and then the flash-etched copper surface is oxidized to obtain a dark color. A shinny copper surface covered by the residual photoresist or the so called scum is revealed. The scum test used in this example comprises of the following successive steps: acid-cleaning followed by water-rinsing, flash-etching in a 5% sodium persulfate aqueous solution followed by water-rinsing, and dark oxidation in a cupric chloride aqueous solution followed by water-rinsing. Except water rinse, the developed sample board was immersed in an etching solution for ca. 10 sec.

A reflection type microscope was used to examine whether or not the sample revealed a brightness of the original surface of the copper which was unable to be etched because of a covering of scum thereon. The results of the tests are shown in Table 1. From the results, it can be appreciated that the sample of Example 5 obtained from the composition containing thiol compound of the present invention does not create scum, and that the samples of Examples 7 and 8 which are produced from the compositions containing thiol compounds which are insoluble in an aqueous alkali solution create greater amount of scum on the copper when compared with the sample of Example 6 which does not contain a thiol compound. Consequently, it can be understood that, when an aqueous alkali developable photosensitive resist composition contains a commonly used thiol compound which is not soluble in an aqueous alkali solution, the photoresist film would create scum. However, when the above thiol compound is replaced by a thiol compound of the present invention, no scum will be produced.

TABLE I

| Example | 5 | 6 | 7 | 8 |
|---|---|---|---|---|
| Smallest width of lines remaining on the copper after development (μm) | 60 | 80 | 50 | 50 |
| Scum | No scum | scum appears only at the edges of the pattern | scum exists | scum exists |

EXAMPLE 9

| Components | Amount (part by wt) |
|---|---|
| Copolymer of methacrylic acid and alkyl acrylates (acid number = 181, weight average molecular weight = 157,000 | 80 |
| SMA-540 (Copolymer of esterified styrene maleic anhydride of Monsanto Co. | 20 |
| Benzyl dimethyl ketal | 10 |
| Trimethylolpropane triacrylate | 25 |
| Tetraethoxylated Bisphenol A diacrylate | 10 |
| Tetraethylene glycol diacrylate | 20 |
| B603 (dye manufactured by Orient Co.) | 0.15 |
| Micheler's ketone | 0.02 |

The above compounds were mixed with thiol compound A and applied onto a copper substrate. The test sample was produced in the way as described in Example 5.

EXAMPLE 10

The experiment of this example was carried out in the same manner as described in Example 9 except that thiol compound A was replaced by thiol compound B.

EXAMPLE 11

The experiment of this example was carried out in the same manner as described in Example 9 except that thiol compound A was replaced by thiol compound C.

EXAMPLE 12

The experiment of this example was carried out in the same manner as described in Example 9 except that thiol compound A was replaced by thiol compound D.

The samples of Examples 9, 10, 11 and 12 were tested and the results of the tests are shown in Table II.

TABLE II

| Example | Range of exposure (mJ/sq · cm) | Adhesion (μm) | Stripping (time/particle size) |
|---|---|---|---|
| (9) | 40–60 | 60 | 55 sec/<2 mm |
| (10) | 40–70 | 60 | 48 sec/<2 mm |
| (11) | 40–60 | 60 | 60 sec/<2 mm |
| (12) | 40–60 | 60 | 53 sec/<2 mm |

In Table II, the range of exposure means the exposure energy which results a resolution of 60 μm line/70±5 μm space. The adhesion was measured in terms of finest lines remaining on the copper (the spacing between lines was 340±15μm). The stripping was determined by immersing the developed boards at 55–60 degree C. in a 2% KOH solution under agitation with a magnet. The results of the stripping tests listed in the Table II are from samples having received 70 mJ/sq.cm in imaging exposure.

What is claimed is:

1. An aqueous alkali developable photoresist composition comprising at least
   1) a carboxyl group-containing polymeric binder,
   2) 1–15% by weight of a photoinitiator based on the binder,
   3) 20–100% by weight based on the binder, of a photoreactive monomer or oligomer containing at least two ethylenically unsaturated double bonds, said monomer or oligomer being selected from the group consisting of polyacrylates and polymethylacrylates,
   4) 0.05–5% by weight based on the binder of a weak aqueous alkali soluble or dispersible thiol compound represented by the formula:

$(X)_a-R-(SH)_b$

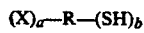

were a, b are integers equal to or greater than 1, R is an organic moiety of molecular weight less than 500, and X is a carboxyl group-containing moiety or hydrophilic organic polymeric segment.

2. An aqueous alkali developable photoresist composition as claimed in claim 1, said polymeric binder has a weight average molecular weight of 10,000–1,000,000, and an acid number of more than 70.

3. An aqueous alkali developable photoresist composition as claimed in claim 1, wherein said binder is a copolymer formed by the copolymerisation of the co-monomers comprising:
   (a) 15–45 mole % of a carboxyl group-containing acrylic monomer or a mixture of carboxyl group-containing acrylic monomers selected from the group consisting of acrylic acid, methacrylic acid, β-carboxyethyl acrylate, phthalic acid acrylate and phthalic acid methacrylate;
   (b) 55–85 mole % of a monomer or a mixture of monomers selected from the group consisting of methyl methacrylate, hydroxy ethyl methacrylate, ethyl acrylate, ethyl methacrylate, butyl acrylate, and butyl methacrylate, and
   (c) 0–10 mole % of a nomomer or a mixture of monomers selected from the group consisting of benzyl acrylate, benzyl methacrylate, phenoxy ethyl acrylate and phenoxy ethyl methacrylate.

4. An aqueous alkali developable photoresist composition as claimed in claim 1, wherein the binder is an esterified styrene-maleic acid anhydride copolymer.

5. An aqueous alkali developable photoresist composition as claimed in claim 1, wherein said binder includes a mixture of copolymers recited in claim 3 and claim 4.

6. An aqueous alkali developable photoresist composition as claimed in claim 1, wherein the hydrophilic organic polymeric segment is a polymer having less than 100 repeating units, selected form the group consisting of polyvinyl alcohol, polyethylene glycol and polyvinyl methyl ether.

7. An aqueous alkali developable photoresist composition as claimed in claim 1, wherein said alkenes consist of one ethylenically unsaturated double bond.

8. An aqueous alkali developable photoresist composition as claimed in claim 1, wherein the number of —SH group in the polythiol of said addition reaction mixture is at least one unit greater than the number of ethylenically unsaturated double bond per polythiol molecule.

9. An aqueous alkali developable photoresist composition as claimed in claim 8, wherein the number of —SH group in the polythiol is at least one unit greater than the number of acid anhydride group per polythiol molecule.

10. An aqueous alkali developable photoresist composition as claimed in claim 7, wherein said polythiol is selected from the group consisting of ethane dithiol, hexamethylene dithiol, decamethylene dithiol, toluene-2,4-dithiol, ethylene glycol bis(thioglycolate), ethylene glycol bis(β-mercaptopropionate), trimethylol propane tris(thioglycolate), trimethylolpropane tris(β-mercaptopropionate), pentaerythritol tetrakis(thioglycolate) and polypropylene ether glycol bis(β-mercaptopropionate).

11. An aqueous alkali developable photoresist composition as claimed in claim 7, wherein said carboxyl group-containing alkene is selected from the group consisting of acrylic acid, propionic acid, crotonic acid, 3-butenoic acid, methacrylic acid, 2-pentenoic acid, 3-methyl crotonic acid, 4-pentenoic acid, tiglic acid, 4-methyl-2-pentenoic acid, 2-hexenoic acid, 3-hexenoic acid, 2-heptenoic acid, 3-heptenoic acid, 2-octenoic acid, 3-octenoic acid, 2-nonenoic acid, 3-nonenoic acid, 2-decenoic acid, 2-undecenoic acid, 10-undecenoic acid, trans-2-dodecenoic acid, 2-tridecenoic acid, 2-hexadecenoic acid, fumaric acid, maleic acid, citraconic acid, itaconic acid, masaconic acid, trans-2-butene-1, 4-dicarboxylic acid, and traumatic acid.

12. An aqueous alkali developable photoresist composition as claimed in claim 7, said hydrophilic segment containing alkene is selected from the group consisting of polyethylene glycol methacrylate and polyethylene glycol acrylate.

13. An aqueous alkali developable photoresist composition as claimed in claim 8, wherein said acid anhydride containing compound is selected from the group consisting of succinic anhydrice, phthalic anhydride.

14. An aqueous alkali developable photoresist composition as claimed in claim 1, wherein the thiol compound is a reaction product from an addition reaction mixture containing a polythiol and a carboxyl group-containing alkene or a reaction mixture containing a polythiol and a hydrophilic segment containing alkene.

15. An aqueous alkali developable photoresist composition as claimed in claim 1, wherein the thiol compound is a reaction product from a condensation reaction mixture containing a polythiol and a cyclic acid anhydride containing compound.

* * * * *

UNITED STATES PATENT AND TRADEMARK OFFICE
CERTIFICATE OF CORRECTION

PATENT NO.  : 5,019,483
DATED       : MAY 28, 1991
INVENTOR(S) : Dhei-Jhai LIN ET AL It is certified that error appears in the above-identified patent and that said Letters Patent is hereby corrected as shown below:

Title page, column 1, Item [73] Assignee:

Please delete "501".

Signed and Sealed this

Twenty-ninth Day of December, 1992

Attest:

DOUGLAS B. COMER

*Attesting Officer*      *Acting Commissioner of Patents and Trademarks*